(12) United States Patent
Larsson

(10) Patent No.: US 6,352,194 B1
(45) Date of Patent: Mar. 5, 2002

(54) METHOD AND APPARATUS FOR CUTTING PIECES FROM, AND WELDING PIECES INTO, SHEET METAL

(75) Inventor: Alf Larsson, Gävle (SE)

(73) Assignee: Sandvik Aktiebolag, Sandviken (SE)

( * ) Notice: Subject to any disclaimer, the term of this patent is extended or adjusted under 35 U.S.C. 154(b) by 0 days.

(21) Appl. No.: 09/460,382

(22) Filed: Dec. 13, 1999

(51) Int. Cl.[7] ............................................... B23K 31/00
(52) U.S. Cl. ........................................ 228/119; 228/171
(58) Field of Search ........................... 228/119, 13, 44.3, 228/171, 45, 50; 266/70; 29/33

(56) References Cited

U.S. PATENT DOCUMENTS

| | | | |
|---|---|---|---|
| 264,776 A | * | 9/1882 | Sharp et al. |
| 293,726 A | * | 2/1884 | Fancher |
| 4,071,942 A | * | 2/1978 | Kowallik |
| 4,593,849 A | * | 6/1986 | Doering |
| 4,760,242 A | * | 7/1988 | Sylvia et al. |
| 4,762,266 A | * | 8/1988 | Schroder et al. |
| 5,443,119 A | * | 8/1995 | Krumszyn et al. |
| 5,575,971 A | * | 11/1996 | Bond |
| 5,836,224 A | * | 11/1998 | Gerber |
| 6,073,324 A | * | 6/2000 | Narbeshuber |

FOREIGN PATENT DOCUMENTS

AU          30143/97          1/1998

* cited by examiner

Primary Examiner—Tom Dunn
Assistant Examiner—Jonathan Johnson
(74) Attorney, Agent, or Firm—Burns, Doane, Swecker & Mathis, L.L.P.

(57) ABSTRACT

A damaged area of a metal sheet, such a conveyor belt, is repaired by affixing frames to upper and lower sides of the sheet, and rotating a center element that is rotatably mounted in one of the frames, whereby a chip-removing cutting blade disposed on the center element cuts a piece out of the metal sheet following a number of rotations of the center element. The same mechanism is used to cut a correspondingly shaped replacement piece from a metal replacement sheet. The replacement piece is then positioned in the hole cut in the sheet to be repaired, and the center element carrying the cutting blade is replaced by a center element carrying a welding device. The welding device welds a joint between the replacement piece and the sheet as the center element is rotated. Inert shielding gas is supplied above and below the weld joint during the welding operation, and support rollers keep the sheet and the replacement piece flush with each other during the welding operation. The frames are secured to the metal sheet by suction pressure generated by a venturi apparatus. The rotatable center elements are mounted into, and removed from, the respective frame by a quick release mechanism.

3 Claims, 7 Drawing Sheets

FIG. 1
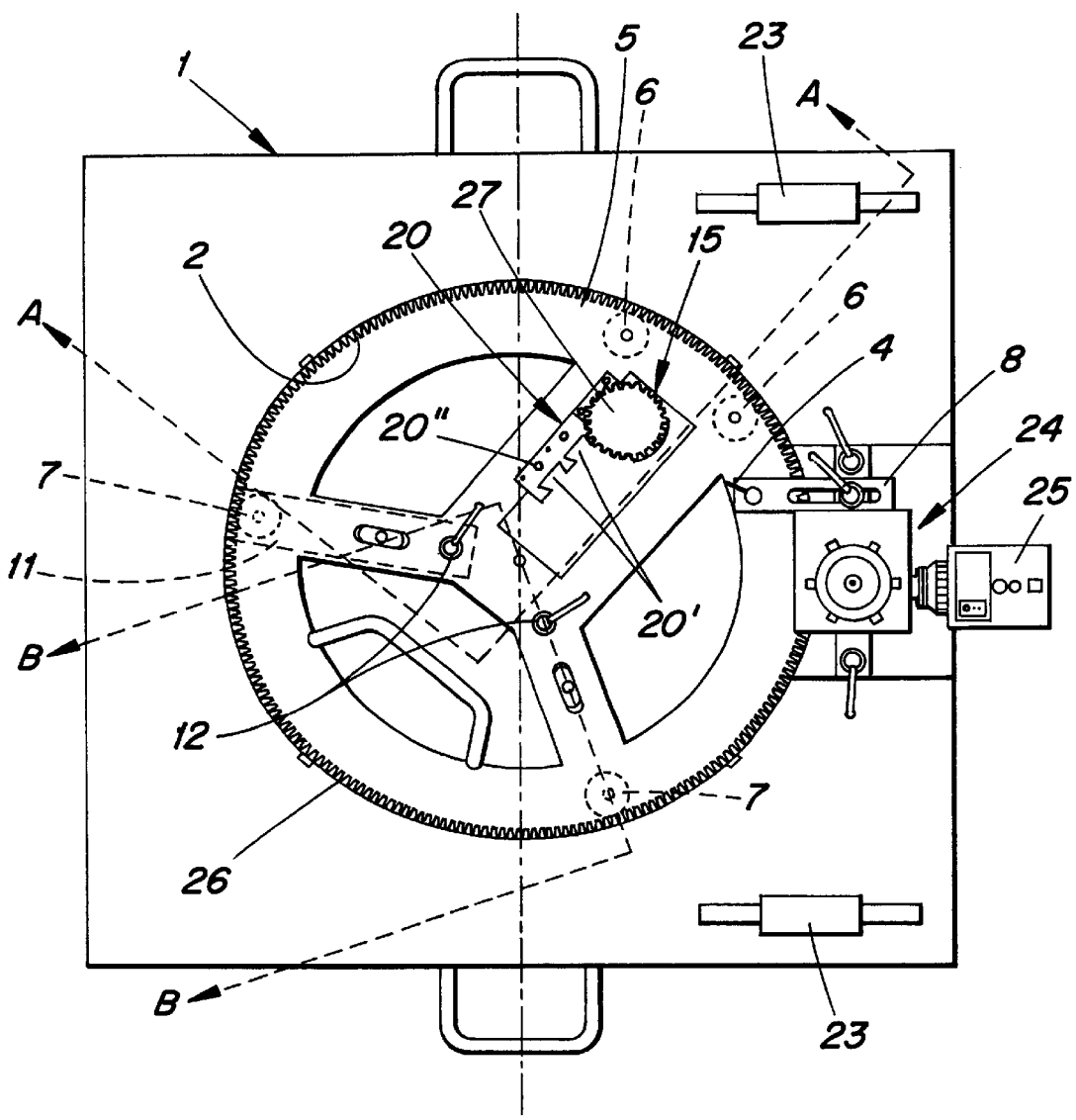
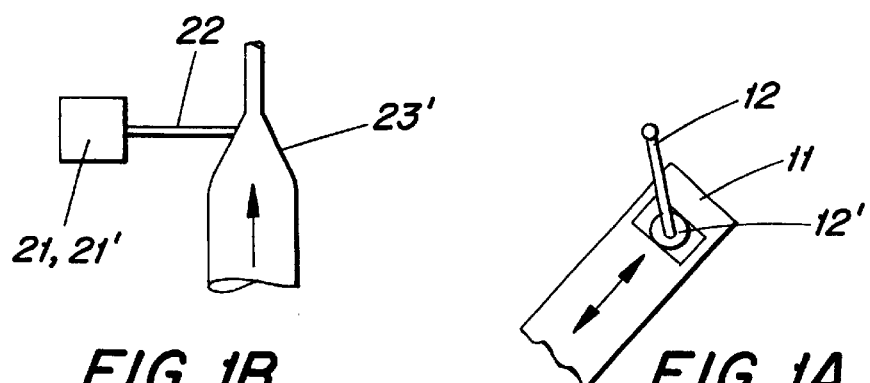
FIG. 1B          FIG. 1A

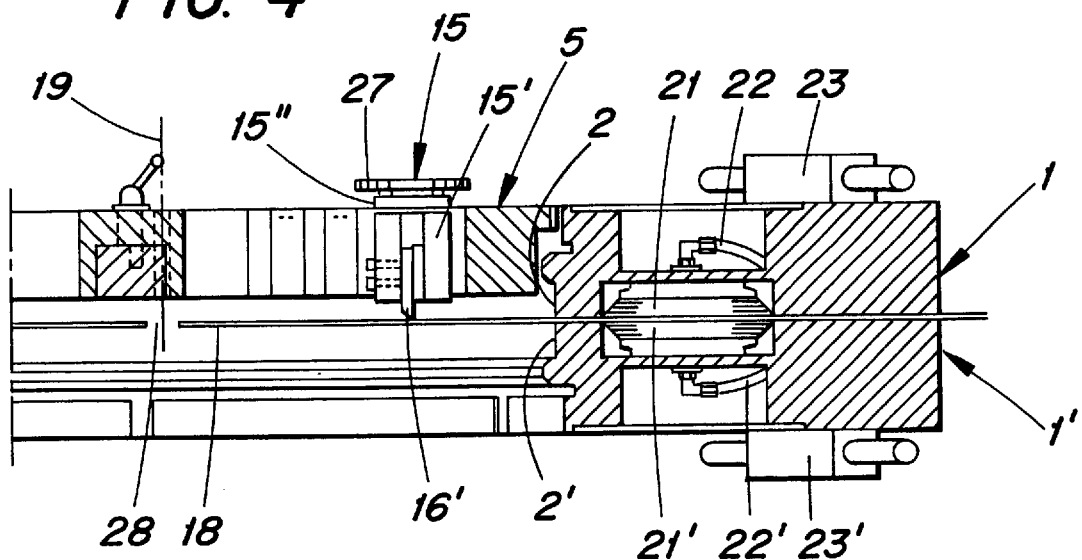
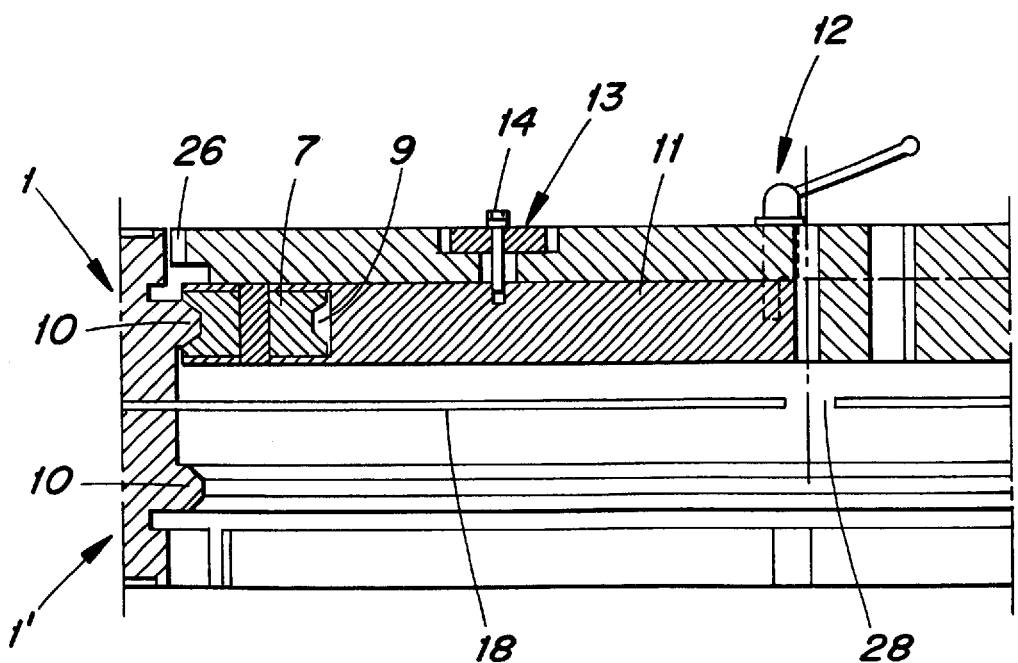

METHOD AND APPARATUS FOR CUTTING PIECES FROM, AND WELDING PIECES INTO, SHEET METAL

TECHNICAL FIELD OF THE INVENTION

The present invention relates to a device and method for repairing damaged sheet metal.

It is common to use sheet metal as a support surface for supporting articles that are being treated and/or conveyed. For example, in the wood-based panels industry, endless steel belts are used as a working sheet for conveying wood chips during the production of wood panels. The belts comprise endless belts arranged in pairs, one above the other. A mixture of wood chips, glue, and filling material is fed between two adjacent flights of the belts that are traveling horizontally at the same speed. The belts are heated and pressed, and transfer the heat and pressure to the mixture to create solidified panels of desired shape. Damage to the belts can occur if the belts are pressed against hard substances that are brought-in along with the wood chips.

It is conventional, when a belt has been damaged, to separate the belts and cut a piece out of the belt, with the damaged region being contained in the cut-out piece. For example, a piece can be cut-out of an edge of the belt if the damaged region is close to the edge. More likely, the damaged region will be near the midpoint of the belt, whereby a substantially circular piece will be cut-out. Then, a pre-manufactured replacement piece of similar size, shape and grade is welded into the hole that was formed in the damaged belt. The replacement piece is smaller than the hole, whereby a gap is formed therebetween, the gap being filled by weld material.

It will be appreciated that it is important for the edges of the replacement piece and the receiving hole to be cut with a certain amount of precision so that the replacement piece achieves a good fit therein to keep the volume of the weld seam at a minimum. That is, the gap should be of narrow and uniform width, and the mutually facing walls of the replacement piece and the hole should extend perpendicular to the plane of the sheet/replacement piece. Also, the top surfaces (and bottom surfaces) of the belt and the replacement piece and the hole should be flush (coplanar) to minimize the formation of irregularities in the surface of the repaired belt.

It is also desirable that the apparatus for cutting and/or welding be relatively light-weight, inexpensive and easy to use.

A conventional apparatus for the cutting-out of damaged areas from sheet metal and the welding-in of pre-manufactured sheet metal pieces is disclosed in Australian application No. AU-A-30143/97. That apparatus employs a guide which is immovably fixed on a metal sheet, and a carrier mounted within a circular opening of the guide for rotation relative to the guide about a center axis of the opening. The carrier has a plurality of spaced-apart supports disposed thereon for retaining respective tools, such as a piece cutting-out tool, an edge-milling tool, and a welding tool. Those tools perform their respective cutting or welding functions as the carrier is rotated by a drive motor.

The guide is immovably held on the sheet metal by either an electromagnet arrangement, or a suction mechanism. The electromagnet arrangement is heavy, and the suction mechanism uses a suction pump, which is relatively expensive. It would be desirable to employ a more economical and yet light-weight mechanism for securing the guide.

The cutting-out of the damaged area from the working sheet is performed by a plasma torch which utilizes an open flame and thus presents a fire risk. Furthermore, the plasma torch produces in the working sheet a hole having an edge characterized by poor geometrical and metallurgical properties that will inevitably require considerable finishing, e.g. milling or grinding. Also, the high heat may produce deformation and/or metallurgical changes in the areas near the cut which would require additional operations to remove them, and thus an even worse hole precision. The lower precision also leads to a wider gap between the belt and the replacement piece, requiring more filler to be inserted, and thus the need for even more heat in the welding process, thereby increasing the potential for deformations and metallurgical changes. It would thus be desirable to eliminate the need for the presence of an open flame and the need for finishing operations.

To minimize problems associated with the heat generated during welding, the conventional apparatus uses a support base attached to the guide and engaging the underside of the replacement piece. The support base carries water cooled copper elements which physically contact the weld area to conduct-away heat. However, such a water cooled arrangement adds weight and cost to the apparatus. It would be desirable to provide a cooling arrangement which is light and less costly.

After the finishing operation has been performed, the milling device must be removed from the carrier and replaced by a welding device, which is relatively time consuming. It would be desirable to minimize the time required for converting the machine between cutting and welding operations.

An additional disadvantage associated with the use of a plasma torch is that the flame cuts through the entire thickness of the metal sheet at one time, i.e., the piece being cut out is cut out in one revolution of the cutter. That means that as the torch has traveled through almost the entire cutting path, the piece being cut out will be suspended from the rest of the sheet by a continuously diminishing strip until it eventually separates. As the piece separates from the sheet, there is a clear risk that the edge of the hole will be damaged, or that a rough burr will remain. Thus, additional finishing would be needed in such a case.

SUMMARY OF THE INVENTION

One aspect of the present invention relates to an apparatus for cutting out a piece of a metal sheet. The apparatus includes upper and lower frames including upper and lower circular holes therein, respectively. Upper and lower releasable securing mechanisms are disposed on the upper and lower frames respectively, for releasably securing the upper and lower frames to upper and lower sides of the metal sheet, respectively, with the upper and lower holes disposed in alignment with one another along an axis. A center element is disposed in a first of the upper and lower frames for rotation relative to the first frame about the axis. A driving mechanism is mounted on either the center element or the first frame, for driving the center element about the axis. A chip-removing cutting tool is mounted on the center element and has a cutting edge arranged to contact the sheet for cutting a piece therefrom as the center element is rotated about the axis.

In another aspect of the invention, a center element is provided which carries a welding device arranged to weld a replacement piece in the hole as the first center element is rotated about the axis. A second center element is disposed in the other frame and is situated on a side of the metal sheet opposite the welding device. The second center element carries spaced projections for bearing against the metal sheet to form a space between the metal sheet and the second center element. A first conduit conducts inert shielding gas to an area immediately surrounding the point of welding, and a second conduit conducts inert shielding gas to the space, whereby inert shielding gas is disposed above and below the sheet.

In another aspect of the invention, a support device is carried by the same frame which carries the welding device. The support device comprises two support rollers mounted on an arm for rotation about a common axis. The support rollers are spaced apart along the axis and are arranged such that one support roller rides on the metal sheet, and the other support roller rides on the replacement piece. The support rollers are biased against the respective metal sheet and the replacement piece to keep the metal sheet flush with the replacement piece.

In still a further aspect of the invention the center element which carries the cutting tool, and the center element which carries the welding device is adapted for quick insertion and removal with respect to its frame. In that regard, either the center element or the frame carries a plurality of guide rollers. The other of the center element and the frame is engageable with the guide rollers to form therewith a radial projection/groove connection permitting the center element to rotate about its axis while preventing movement of the center element along the axis. At least one of the guide rollers is moveable radially with respect to the axis of rotation to selectively produce engagement and disengagement of the radial projection/groove connection. The center element is removable from the frame in response to such disengagement.

In still a further aspect of the invention, the frames are secured to the metal sheet by releasable securing mechanisms. Each securing mechanism includes a cup for engaging the sheet, a venturi device through which a positively pressurized gas is conducted for establishing a vacuum, and a conduit for transmitting the vacuum to the cup for adhering the cup to the sheet.

The present invention also relates to a method of welding a metal replacement piece in a hole of a metal sheet. The method comprises the steps of:

A) affixing upper and lower frames on top and bottom sides, respectively, of the metal sheet, one of the frames carrying a rotatable center element that has a welding device mounted thereon;

B) supporting the replacement piece in the hole whereby a narrow gap is formed between an outer periphery of the replacement piece and a wall of the hole;

C) rotating the center element to bring the welding device to spaced locations along the gap and making a spot weld at each of the locations using filler wire; and thereafter D) making segment welds between respective pairs of spot welds until the entire gap has been welded.

BRIEF DESCRIPTION OF THE DRAWINGS

Below a preferred embodiment of the device and method according to the present invention will be described, reference being made to the accompanying drawings, where;

FIG. 1 shows a top view of a device for cutting according to the present invention;

FIG. 1A is an enlarged fragmentary view of part of the apparatus depicted in FIG. 1;

FIG. 1B is a schematic view of a venturi used in the FIG. 1 apparatus;

FIG. 4 shows a section taken along A—A in FIG. 1 during the cutting-out of a damaged region from a working sheet;

FIG. 5 shows a section along B—B in FIG. 1 during the cutting-out of a damaged region from a working sheet;

DETAILED DESCRIPTION OF A PREFERRED EMBODIMENT OF THE INVENTION

Figure 2:
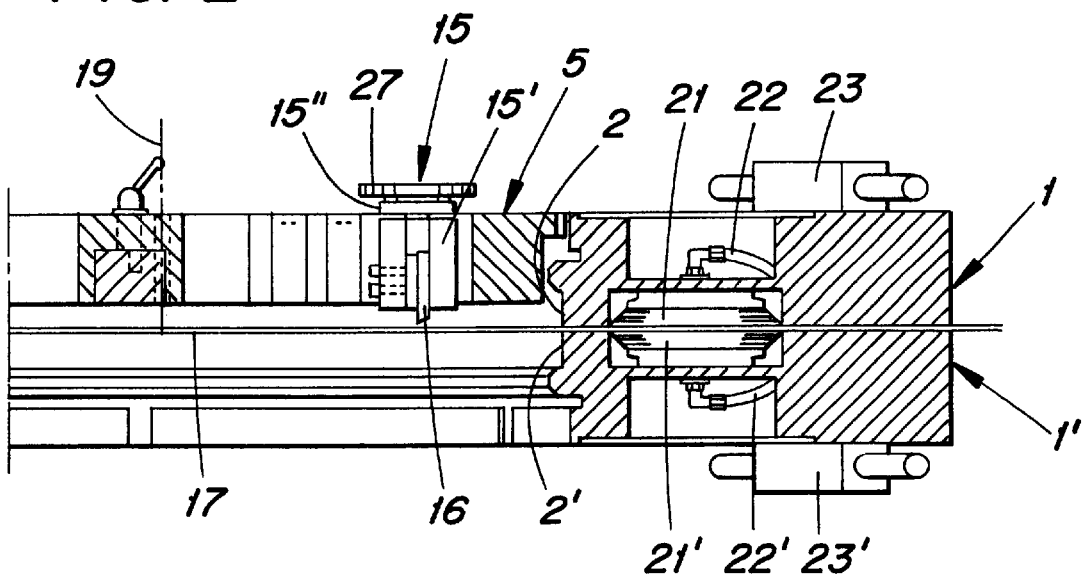
FIG. 2 shows a section taken along A—A in FIG. 1 during the cutting-out of a replacement piece.
Figure 3:
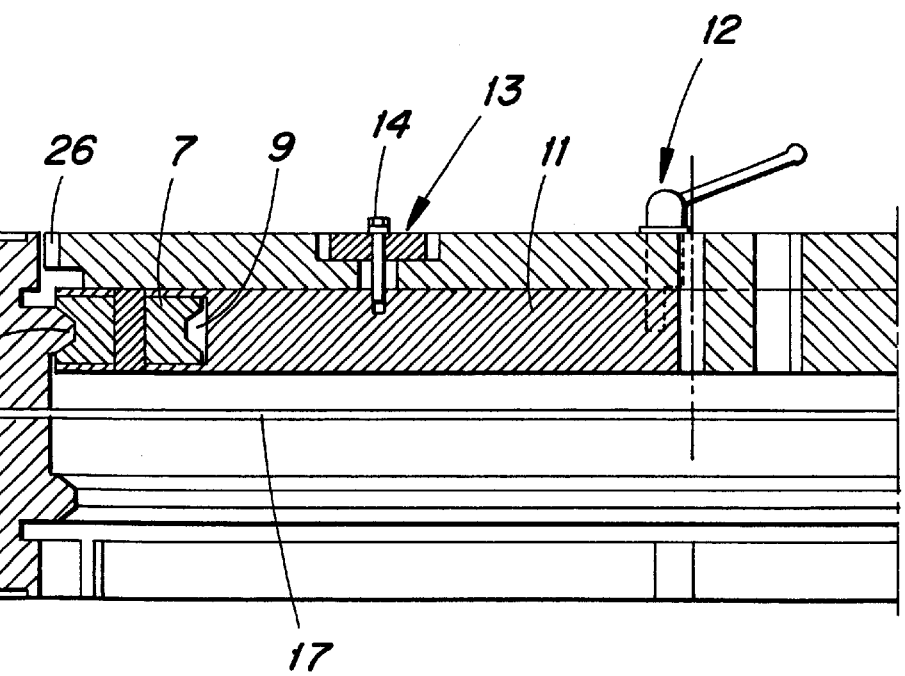
FIG. 3 shows a section taken along B—B in FIG. 1 during the cutting-out of a replacement piece.

In accordance with the present invention there is provided a frame structure adapted to be removably fixed to sheet metal, and adapted to support a center element for rotation about an axis. Two different center elements 5 and 5' are provided, one of which (no. 5 in FIGS. 1–5) is used for cutting-out replacement pieces, and the other of which (no. 5' in FIGS. 6–8) is used for welding-in replacement pieces.

A cutting device according to the present invention, shown in FIGS. 1–5, comprises an upper frame 1, a lower frame 1' (see FIGS. 2–4), and a first rotatable center element 5. The rotatable element 5 is received in a circular opening 2 of the upper frame 1, i.e., the center element 5 also has a circular outer periphery. The upper and lower frames 1 and 1' are in principal identical, i.e., the lower frame 1' is also provided with a corresponding circular opening 2'. Preferably, the frames 1, 1' are formed of a light-weight material, such as aluminum.

The first rotatable center element 5 is guided in the upper frame 1 by means of two fixed guide rollers 6 and two radially displaceable guide rollers 7. Each of the guide rollers 6 and 7 is carried by the center element 5 and is provided with a circumferential groove 9 that cooperates with an annular projection 10 formed on the wall of the circular opening 2 of the upper frame 1 (see FIG. 5). The annular projection 10 extends along the entire circumference of the circular opening 2. In the shown embodiment the two displaceable guide rollers 7 are journalled in respective arms 11 supported movably by the first rotatable center element 5 (see FIG. 3). Each of the arms 11 is manually displaceable in a radial direction of the first rotatable center element 5 by means of an eccentric cam 12' that is rotated by a handle 12 that is rotatably mounted in the center element 5 (see FIG. 1A which omits the element 5 for the sake of clarity). Alternatively, a single eccentric could be provided which is common to both arms 11. Each arm 11 is locked in position by means of a respective locking device 13 that includes a locking screw 14. By tightening the screw 14, the respective arm 11 is pulled tightly against the underside of the element 5.

Thus, by retracting the arms 11 radially inwardly, the center element 5 can be inserted into the hole 2 such that the grooves 9 of the rollers 6 receive the projection 10, and the center element 5 is coplanar with the frame 1. Then, the arms 11 can be extended to cause the grooves 9 of the rollers 7 to receive the projection 10, thereby securing the center element 5 to the frame 1 for rotation relative thereto. The locks 13 ensure that the rollers 7 do not become accidentally dislodged from the projection 10.

It will be appreciated that the rollers 6, 7 could be positioned on the frame 1 (rather than on the center element 5) for receiving a radial projection formed on the center element 5. Also, the annular projection could be formed on each roller 6, 7 (rather than on the frame 1), with the groove being formed in the frame. It is only important that a radial projection/groove connection be established between the rollers and the frame 1 (or the center element 5) which permits the center element 5 to rotate about an axis, while preventing axial movement of the center element, and that enough of the guide rollers be radially movable to enable the center element to be removed from, or inserted into, the frame 1. This provides for a relatively rapid installing and removing of the center element while still maintaining a high level of precision.

As is shown in FIGS. 1, 2 and 4 the first rotatable center element 5 is provided with a supporting device 20 and a cutting device 15 mounted therein. The supporting device 20 includes three recesses 20' spaced from the axis of rotation of the element 5 by different distances. The cutting device 15 comprises a holder 15' configured to be mounted in any of the recesses. A plate 15" is attached to the upper frame 1 by screws (not shown) that are threadedly received in holes 20" (FIG. 1) of the supporting device 20. A rotary toothed wheel 27 is provided for raising and lowering the block 15'. The toothed wheel 27 is rotatably mounted in the plate 15" and carries a threaded pin that is threadedly connected to the holder 15'. By rotating the wheel 27, the holder 15', which is held against rotation, is caused to move vertically. As will be explained later, the wheel 27 contacts a driving detent 4 during each revolution of the center element 5, whereby the wheel is rotated by a predetermined increment.

The cutting device 15 includes replaceable chip-removing cutting tools 16 and 16' (e.g., cutting-off blades), see FIGS. 2 and 4, having an extension perpendicular to a metal sheet 17 or 18 that is worked by the cutting tools 16 and 16'. When studying FIGS. 2 and 4 in detail it is realized that the cutting tools 16 and 16' are mounted in different positions. That is, in FIG. 2 the pointed cutting edge of the cutting tool 16 is located at the left side of the cutting tool 16, while in FIG. 3 the pointed cutting edge of the cutting tool 16' is located at the right side of the cutting tool 16'. The purpose of the two alternative positions of the cutting tools 16 and 16' will be explained below in connection with the description of the functioning of the device according to the present invention. In this connection it should be pointed out that since the cutting device 15 may be mounted in one of three different positions in the supporting device 20, the cutting tools 16, 16' are able to cut metal sheets at one of three different radii of curvature.

As is shown in FIGS. 2 and 4, the upper and lower frames 1 and 1' are equipped with suction cups 21 that, via hoses 22, are connected to vacuum units 23. Each vacuum unit 23 includes a venturi 23' (see FIG. 1 B). The vacuum units 23 are designed in such a way that when a compressed air source (not shown) is connected with the venturi 23' of a vacuum unit 23, a vacuum is established by venturi action as positively pressurized gas flows through the venturi 23', and that vacuum is transmitted to the adherent suction cup 21. This means that only a compressed air source is needed to establish a vacuum inside the suction cups 21, in contrast to the need for a more expensive suction pump as in the prior art.

As is shown in FIG. 1, a driving unit 24 for the first rotatable center element 5 is detachably mounted on the upper frame 1. The driving unit 24 includes a power source in the form of an electric motor 25. The driving unit 24 includes a gear wheel (not shown) that cooperates with a gear rim 26 of the first rotatable center element 5. The gear rim 26 extends along the entire circumference of the first rotatable center element 5. When the motor 25 is driven, the first center element 5 is caused to rotate.

Function of the Device for Cutting Out Circular Replacement Pieces

The method according to the present invention involves, in an initial step, cutting out a replacement piece D from a first metal sheet 17; in a second step, cutting a hole in a second metal sheet 18, i.e., the damaged metal sheet (such as a conveyor belt) that is to be repaired; and in a third step, welding the replacement piece into the hole of the working sheet 18. If the damaged part of the sheet lies adjacent an edge of the sheet, the hole will comprise a recess cut in the edge. Otherwise, if the damaged area is remote from the edge, a substantially circular hole will be cut.

When a circular replacement piece is cut out from a first metal sheet 17, it is recommended that the first metal sheet 17 be of exactly the same steel grade as the second metal sheet 18 to be repaired. Of course, the thickness of the two metal sheets 17 and 18 must be exactly the same.

Before cutting out the replacement piece, the upper frame 1 is rigidly mounted to the upper side of the first metal sheet 17 by means of the vacuum cups 21. That is, compressed air, fed to the vacuum units 23, creates, by a venturi action, a vacuum inside the suction cups 21. The lower frame 1' is also mounted to the lower side of the first metal sheet 17, that mounting being effected in principally the same way as the upper frame 1. In order to bring the upper frame 1 and the lower frame 1' exactly opposite to each other at both sides of the first metal sheet 17, a manual measurement relative to one edge of the first metal sheet 17 is carried out. A centering hole must not be drilled in the first metal sheet 17 since such a hole would damage the replacement piece. The reason why both the upper frame 1 and the lower frame 1' are needed in connection with the cutting out of the replacement piece is that vibrations in the first metal sheet 17 should be avoided in connection with the cutting operation.

In a next step, the first rotatable center element 5 is mounted in the circular opening of the upper frame 1, with the arms 11 in a radially retracted state. By then rotating the handles 12, the arms 11 are displaced radially outwards, thus bringing the grooves 9 of the rotatable guide rollers 7 into engagement with the annular projection 10 to secure the center element 5 to the upper frame 1. Each arm 11 is then locked in place by means of the adherent locking device 13. Then, the driving unit 24 is mounted on the upper frame 1, and the gear wheel (not shown) of the driving unit 24 is brought into engagement with the gear rim 26 of the first rotatable center element 5.

In a next step the cutting device 15 is mounted in one of its three possible positions in the supporting device 20. In this connection it should be observed that the cutting tool 16 abuts the upper side of the first metal sheet 17, the cutting tool 16 being oriented in the manner shown in FIG. 2, i.e., the pointed cutting edge of the cutting tool 16 located at the left side of the cutting tool 16. The cutting depth of the cutting tool 16 is adjusted during the cutting operation by rotation of the toothed wheel 27 of the cutting device 15. Rotation of the toothed wheel 27 is achieved automatically in response to rotation of the center element 5. That is, a driving detent 4 is fixed to the upper frame 1 in such a position as to cause the wheel 27 to be contacted, and rotated incrementally, by the detent 4 during each revolution of the center element 5. Thus, the depth of the cutting tool 16 increases after each revolution of the center element 5. The device according to FIG. 2 is now ready for cutting out the circular replacement piece and in order to commence that cutting operation, the driving unit 24 is activated, causing the rotatable center element 5 to rotate. After the driving unit 24 produces a number of revolutions of the first rotatable center element 5, between which the wheel 27 is rotated to gradually lower the cutting tool, the circular replacement piece is cut out, i.e., separated from the first metal sheet 17. The upper and lower frames 1, 1' and the first rotatable center element 5 are then removed from the first metal sheet 17.

In order to describe the cutting of a hole in the second metal sheet 18, i.e., the damaged metal sheet that is to be repaired, reference is made to FIGS. 4 and 5. The second sheet 18 is preferably still in its operative position in a mechanism in which it is employed. That is, the repairing of the sheet 18 is to be accomplished without disturbing the surrounding mechanism. In a first step, a center hole 28 is drilled in the second metal sheet 18, the center hole 28 normally being drilled by a hand-held drilling machine. The upper and lower frames 1 and 1' are then mounted on both sides of the second metal sheet 18, with the rotational center axes 19 and 19' of the frames 1 and 1', respectively, being aligned with the center of the center hole 28.

Figure 10:
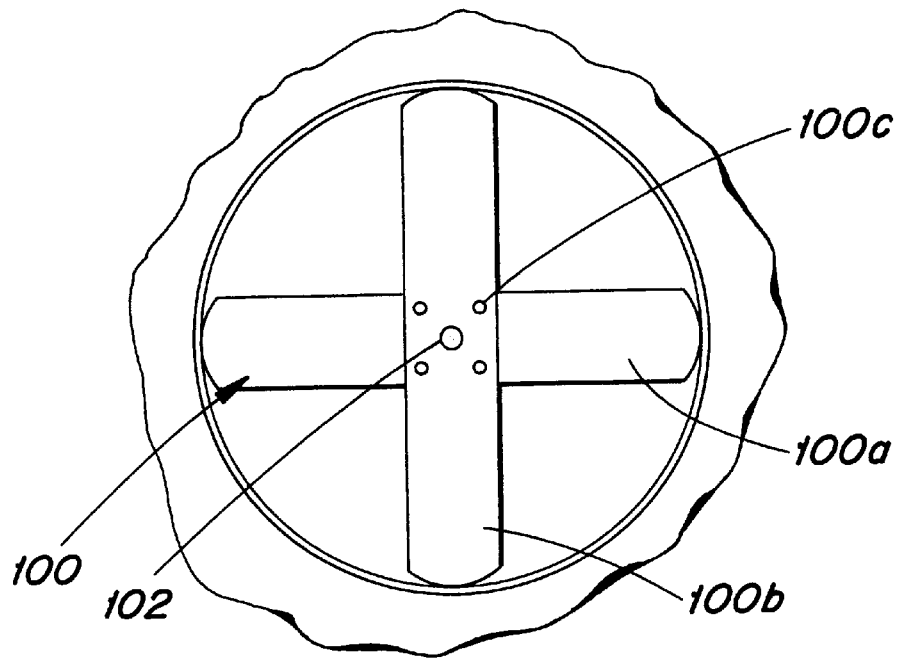
FIG. 10 is a top plan view of the invention depicting a cross used for aligning frames on a metal sheet.
Figure 11:
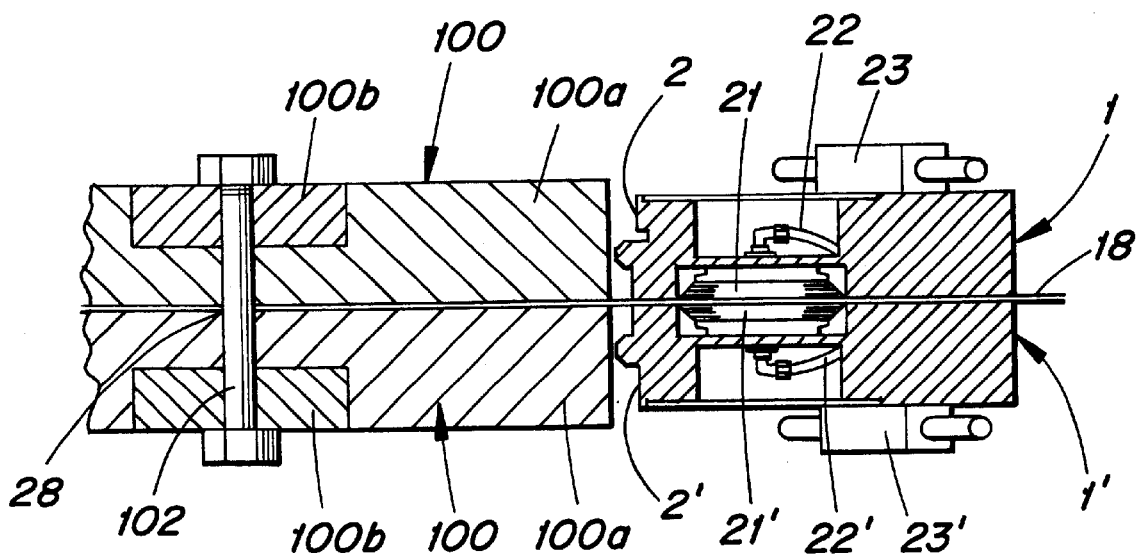
FIG. 11 is a cross sectional view taken through an end portion of the cross depicted in FIG. 9.

In order to achieve this centered positioning of the upper and lower frames 1, 1' a centering element in the shape of two crosses 100 is used (see FIGS. 10–11). One cross 100 is located in the upper frame 1 on the upper side of the second metal sheet 18 and the other, identical cross (not shown) is located in the lower frame 1' on the lower side of the second metal sheet 18. The crosses are interconnected by a pin or bolt 102 or the like, extending through the center hole 28. Each cross includes a pair of plates 100a, 100b oriented at right angles and secured together by threaded fasteners 100c.

The upper frame 1 and the lower frame 1' are mounted to the upper and lower sides, respectively, of the second metal sheet 18, the two crosses 100 being received in the circular openings 2, 2' of the frames 1, 1'.

Thereby, it is guaranteed that the frames 1, 1' are located in exact opposite positions at both sides of the second metal sheet 18. The frames 1, 1' are fixed to the second metal sheet 18 by means of the vacuum suction cups 21, 21', this being effected in the same way as has been described above. When the frames 1, 1' have been fixed to the second metal sheet 18, the crosses are removed and the first rotatable center element 5 is mounted in the circular opening 2 of the upper frame. The first rotatable center element 5 carries the cutting device 15 in the same recess of the supporting device 20 as when the replacement piece was cut out. However, as can be seen from FIG. 4, a cutting tool 16 has been installed, which is oriented such that its pointed cutting edge is located at the right side of the cutting tool 16'.

The manner of mounting the element 5 has already been described in connection with the cutting out of the replacement piece. The driving unit 24, with the power source 25, is then mounted on the upper frame 1, and the device for cutting out the replacement piece is ready for use.

Since the cutting-out of a piece of the metal sheet is accomplished by gradually increasing the depth of the cut after each revolution of the cutting blade, the piece will eventually separate from the sheet at a moment when it is attached to the sheet by a very small strip. Hence, the risk of the edge of the hole being damaged, or a burr remaining, are small as compared with cutting operations using a plasma torch, as described earlier herein.

In a typical cutting operation using the cutting-off blade 16 to cut a circular piece from a steel belt having a thickness of 1.80 mm, the cutting blade is given a vertical feed rate of 0.04 mm/rev. and a rotary speed of 18–20 m/min. The cut is usually accomplished after about 45 revolutions of the blade.

The actual cutting is effected by rotating the first rotatable center element 5 by the driving unit 24. The cutting depth is adjusted automatically by means of the toothed wheel 27 and the driving detent 4 in the same way as in connection with the cutting-out of the replacement piece. In connection therewith it should be mentioned that the cutting action, so called planing, used for cutting both the replacement sheet and the working sheet, generally generates only a small amount of heat.

Welding-in a Circular Replacement Piece

The next step in the method according to the present invention is to weld the replacement piece D into the hole of the working metal sheet 18. Although, when cutting the replacement piece and the hole, two cutting tools 16, 16' are used, those cutting tools 16, 16' are cutting at essentially the same radius. This means that the diameter of the replacement piece is almost identical to the diameter of the hole in the working metal sheet, i.e., the width of the gap or welding seam between the replacement piece and the edge of the hole is extremely small. Also, the opposite cylindrical surfaces in the welded joint formed by the edge of the replacement piece and the hole edge are coaxial and extend perpendicular to the plane of the metal sheet 18. The fact that the fit between the replacement piece and the hole is very close creates a stabilizing effect upon a shrinking stress that tends to occur during welding.

It should also be noted that the edge of the hole in the sheet 18 cut by the tool 16 is relatively smooth and precise and does not require substantial finishing, e.g., milling or grinding.

Figure 6:
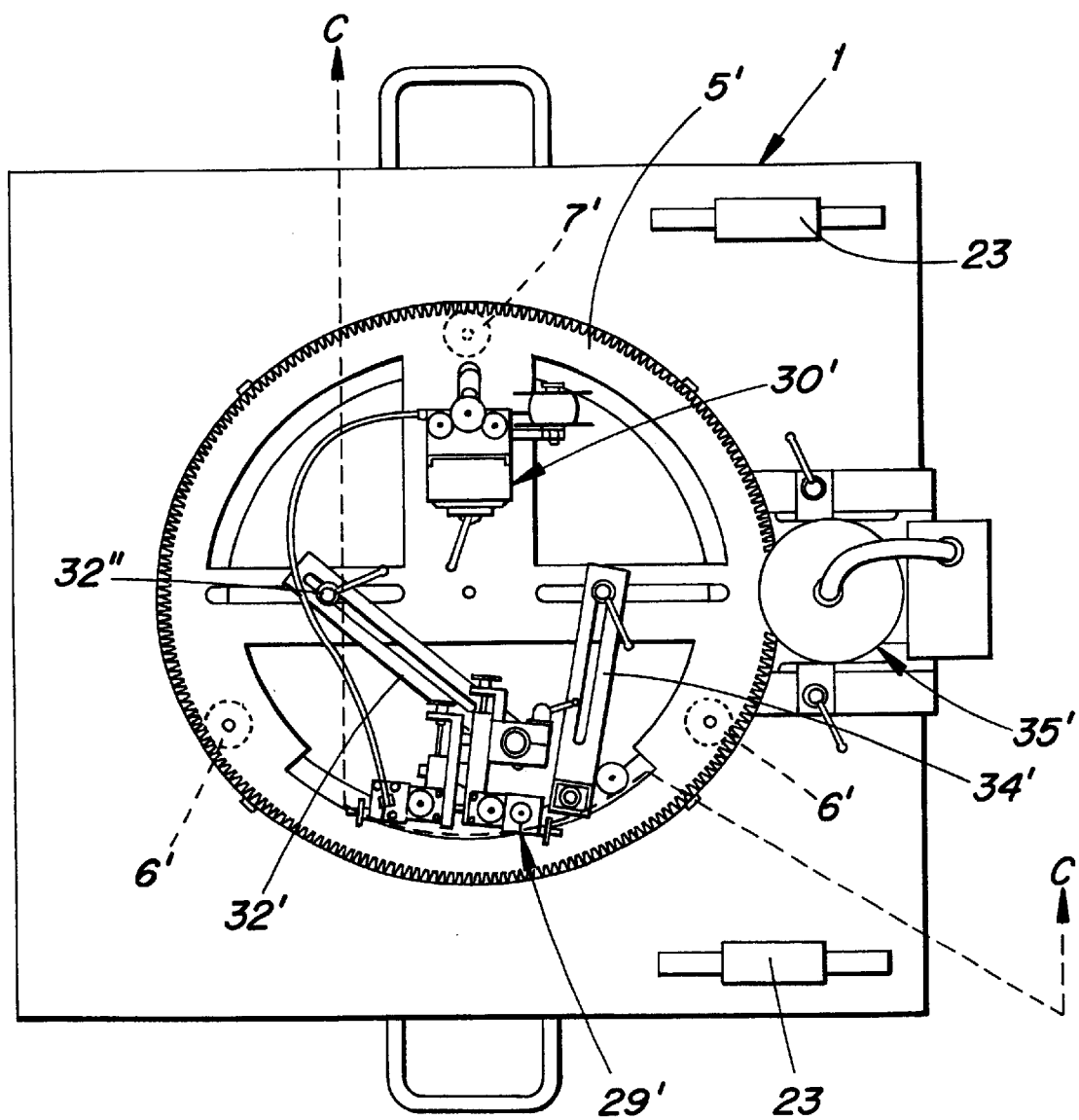
FIG. 6 shows a top view of a device for welding according to the present invention.
Figure 7:
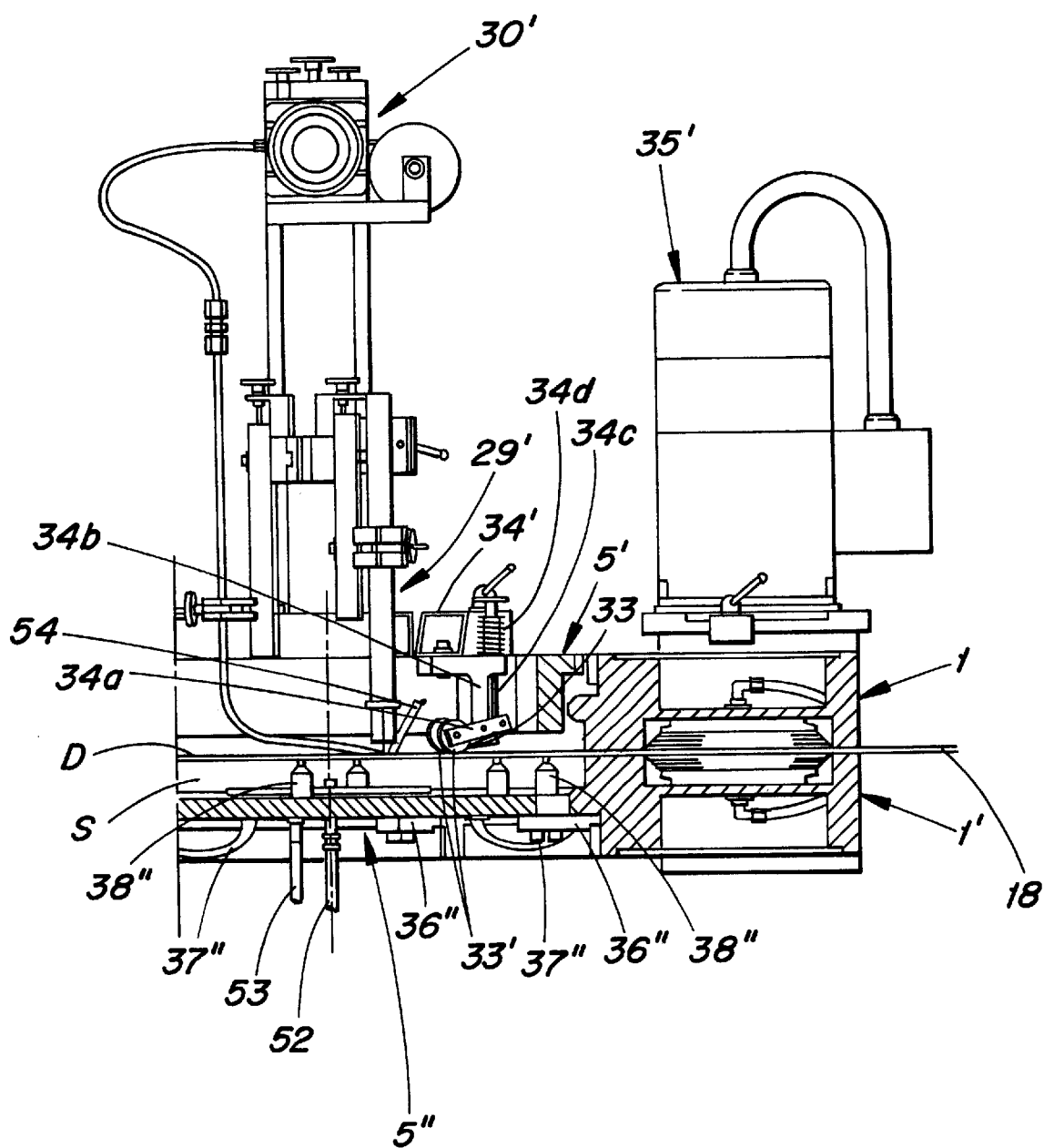
FIG. 7 shows a section along C—C in FIG. 6.

When effecting a welding-in of the replacement piece, the first rotatable center element 5 is removed and replaced by the second rotatable center element 5', see FIGS. 6 and 7. The second rotatable element 5' carries two fixed guide rollers 6' and one displaceable guide roller 7'. The mechanism for displacing the displaceable guide roller 7' to secure the second center element 5' to the second frame 1' corresponds in principal to the displacing mechanism described above in connection with FIG. 3.

Figure 8:
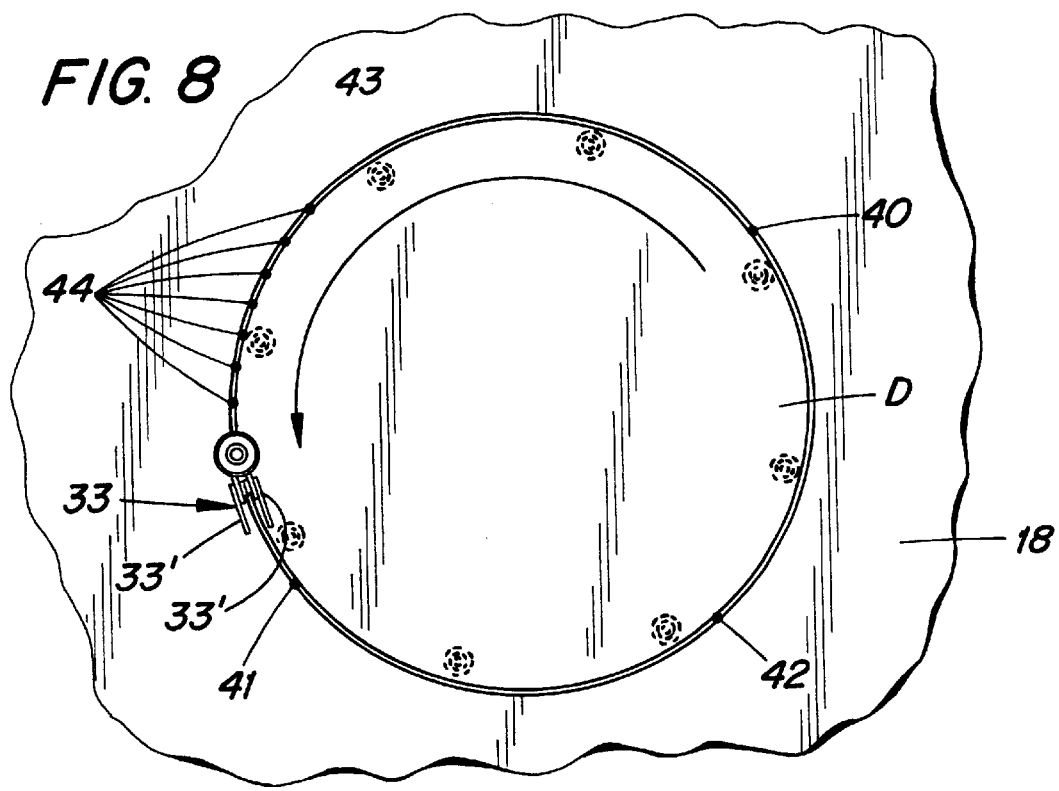
FIG. 8 shows a welding configuration according to the present invention.

The second rotatable center element 5' carries a tool in the form of a welding device that includes a welding torch 29'. The welding device further comprises a feeding device 30' for the filler wire and a holding device for the filler wire. The welding torch 29' and the holding device are adjustable by means of a first adjustable lever 32' which can be secured by a nut 32" in various positions of adjustment. In connection with the welding torch 29' the welding device also has a spool-shaped rotary support member 33 which includes a pair of interconnected support rollers 33' suspending from a second adjustable lever 34'. The support member 33 is rotatably mounted on one end of an arm 34a that is pivotably mounted to a bracket 34b hanging down from the lever 34', whereby the support member 33 and the arm 34a can rotate about respective axes oriented parallel to one another and orthogonally to the axis of rotation of the center element 5'. The other end of the arm 34a is connected to a rod 34c that is biased upwardly by an adjustable spring 34d. The lever 34' can be adjusted so that one of the support rollers 33' rides on the working sheet 18, and the other support roller 33' rides on the replacement piece D, as shown in FIG. 8. Thus, the adjacently disposed surfaces of the replacement piece and the working sheet 18 are kept substantially flush with one another. When welding is to be performed, the driving unit 24, see FIG. 1, is replaced by an electric pulse motor 35', the pulse motor 35' being detachably mounted on the upper frame 1 and effecting rotation of the second rotatable center element 5' in a similar way as the first center element 5 is caused to rotate, i.e., a gear rim 26' of the second rotatable center element 5' cooperates with a gear wheel (not shown) of the electric pulse motor 35'.

As can be seen from FIG. 7 a stationary center element 5" is mounted in the lower frame 1', the stationary element 5" being fixed to the lower frame 1' by means of bayonet couplings 36". In order to easily mount the stationary center element 5", the lower side of the element 5" is provided with handles 37". When mounting the stationary center element 5", the element 5" is raised from below into the circular opening 2' of the lower frame 1'. When the stationary center element 5" reaches its axial end position, it is turned so that the bayonet couplings 36" are engaged.

At its upper side, i.e., the side facing the second metal sheet 18, the stationary center element 5" is provided with supporting pins 38". The upper free ends of the supporting pins 38" are provided with adjustable spring loaded balls, the balls making contact with the underside of the replacement piece D to support the replacement piece at a distance above the center element 5" and thereby form a space S beneath the replacement piece.

When carrying out a welding of the seam between the second metal sheet 18 and the replacement piece D, the welding is preferably carried out in two steps. Firstly, welding is effected on the upper side of the metal sheet 18, and subsequently in an optional second step, welding is effected on the lower side of the metal sheet 18. The principal difference between the first and second welding steps is that in the second step, no filler wire is supplied.

To perform the second step of welding, the second rotatable center element 5' (carrying the welding device) and the stationary center element 5" exchange places with each other. Also the pulse motor 35' would be mounted on the lower frame 1". Such welding in two steps is the welding procedure normally preferred. However, if the metal sheet were very thin, it might be sufficient to carry out welding from one side only.

When welding from the upper side of the metal sheet 18, i.e., the arrangement shown in FIGS. 6 and 7, the welding procedure commences with so-called spot welding (see FIG. 8). When welding is to be effected, the second rotatable center element 5' is rotated by means of the pulse motor 35'. In an initial state, spot welding is normally carried out using manual positioning, i.e., a first spot weld 40 is located at an arbitrary location, then a second spot weld 41 is located diagonally opposite the first spot weld, then a third spot weld 42 is located equidistant between the first and second spot welds, then a fourth spot weld 43 is located diagonally opposite the third spot weld, and so on. The rest of the spot welds 44 are normally effected by automatic positioning and automatic welding. The distances between adjacent spot welds are chosen in such a way that the arising shrinking stresses are taken care of in a proper way. In this connection it should be pointed out that when a spot weld is effected (which makes unnecessary a rigid holding of the entire sheet 18 and the replacement piece D), the support member 33 acts in the area of the spot weld by pressing against both the metal sheet 18 and the replacement piece D, in order to cause the metal sheet 18 and the replacement piece to be level (flush) with each other. The structural design of the stationary center element 5", whereby the space S is formed beneath the replacement piece, makes it possible to introduce shielding gas beneath the replacement piece when welding is performed at the upper side of the metal sheet. That is, inert shielding gas, such as argon, is stored in a tank (not shown) seated on the floor. A hose 52 conducts shielding gas to the space S, and a hose 53 conducts the shielding gas away from the space S. A conduit 54 conducts shielding gas to the point of welding from a tank (not shown) mounted on the center piece 5' or from a tank mounted on the floor. Thus, protective shielding gas is provided both above and below the metal sheet to provide maximum protection against arcing and oxidation.

Furthermore, the application of the inert gas has a cooling effect. By providing a cooling action at both sides of the metal sheet, the need for a water-based cooling system is avoided.

Figure 9:
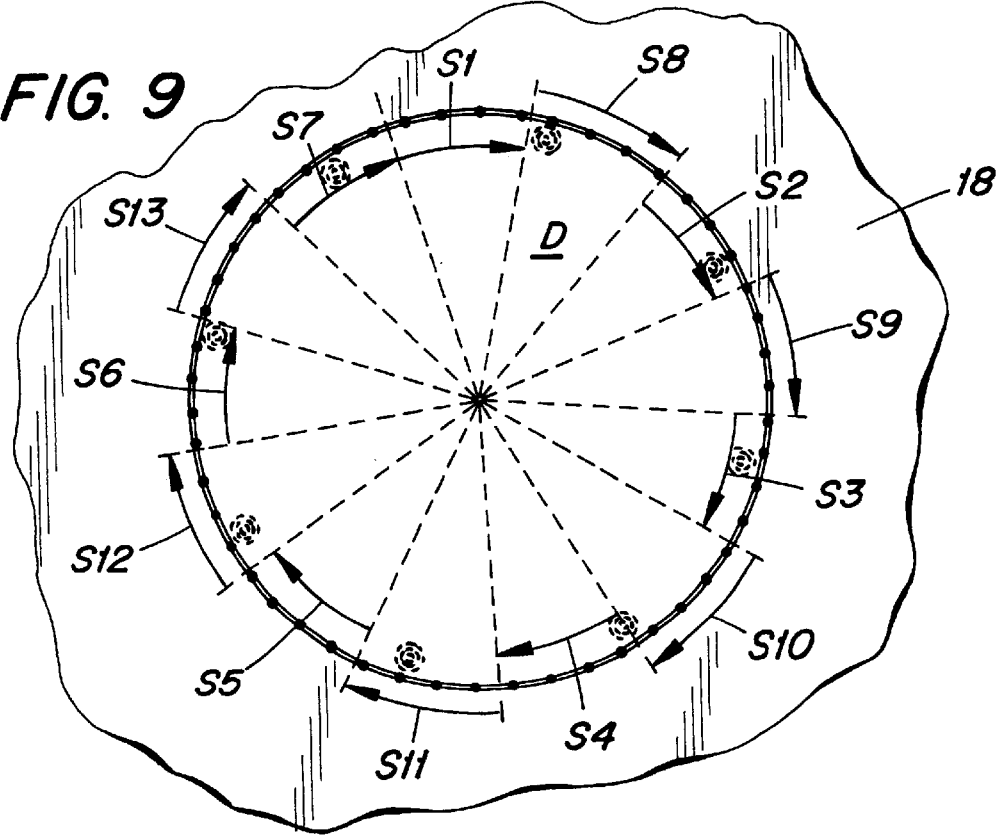
FIG. 9 schematically depicts a segment welding operation according to the present invention.

When the spot welding has been completed, a finishing welding takes place (see FIG. 9). In such a welding operation, a filler wire is supplied to the gap between the replacement piece D and the second metal sheet 18. The finish welding is preferably carried out intermittently in accordance with the scheme that is disclosed in FIG. 9, i.e., in thirteen segments that in FIG. 9 have been allotted the reference numerals S1–S13. It is assumed that the finishing welding starts with the segment S1. Then, the next segment S2 is welded. Then the welding continues along segments S3–S13. By studying FIG. 9, it is learned that a first welding phase comprises segments S1–S7 while the next welding phase comprises segments S8–S13. Generally, it should be pointed out that each segment to be welded is not located adjacent the previously welded segment. This arrangement is advantageous in handling the heat that is generated in connection with the finish welding, and after each welding of a segment there is also a pause to allow the welded segment to cool before the welding of the next segment starts. It will also be appreciated that shielding gas is supplied to the space S during the segment welding. The finish welding on one side of the metal sheet is now completed.

Then, the second rotatable center element 5' and the stationary element 5" change places. The above described welding operation is repeated with the difference that no filler wire is supplied.

When double-sided welding is performed, the welding seam, produced on one side, has a thickness that corresponds to only a portion of the entire thickness of the second metal sheet 18. Preferably, the thickness of the welding seam should be somewhat larger than half the entire thickness of the second metal sheet 18.

When the welding operation has been completed, whether it is double-sided welding or welding from one side only, then the frames 1, 1', including the welding device, are removed from the metal sheet 18, this removal being affected by inactivating the suction cups 21, 21'.

The next step of the method according to the present invention involves grinding the second metal sheet 18. This is normally carried out by means of a hand held grinding machine, which evens out the welding seams, i.e., the overflow of the welding seams is ground away. When a smooth surface with good finish has been achieved by the grinding operation then the method according to the present intention will have been completed.

The major advantages of the invention are summarized as follows.

The use of non-thermal cutting tools for cutting the damaged piece and the replacement piece avoids deformation or metallurgical damage in both the sheet and the replacement piece during cutting operations, and enables a highly precise cut to be made that requires no appreciable finishing. The resulting gap between the replacement piece and the sheet is narrow and uniform and formed by walls that are perpendicular to the plane of the sheet. This minimizes the amount of filler and heat needed during a welding operation.

The presence of support rollers on opposite sides of the weld, together with frames held firmly to upper and lower surfaces of the sheet effectively resists the creation of deformations at the point of welding, leading to more precise welds and a highly flush relationship between the adjacent surfaces of the sheet and the replacement piece.

The welding method whereby the replacement piece is initially fixed in position by spot welds, followed by the welding of segments, minimizes the risk of deformation during the welding operation. Also, the need to rigidly hold the sheet and the replacement piece in areas more remote from the weld area is eliminated. This, in combination with the use of low-weight aluminum to form the frames, and the use of low-weight vacuum frame fasteners (as compared with heavy electromagnets), produces a relatively low weight apparatus which is advantageous, since the apparatus is usually to be transported to the cite of the damaged sheet (to avoid the need to disassemble the sheet from the mechanism in which it is employed).

The ability to apply inert shielding gas to the lower side of the metal sheet during welding on the top side not only provides maximum protection against arcing and oxidation, but also provides sufficient cooling to avoid the need for employing other, more expensive and heavier, cooling expedients.

The quick mounting/release of the center element 5, 5' due to the use of retractable rollers 7 means that two different center elements 5, 5' can be conveniently used, one adapted for cutting and the other adapted for welding. There is no need to replace the welding equipment with the cutting equipment, and vice versa, in a permanently mounted center element.

The ability to achieve a vacuum by means of a compressor (rather than a suction pump) for securing the frames to the metal sheets 17, 18 achieves an appreciable cost savings.

The provision of a pair of support rollers for keeping the replacement piece flush with the metal sheet during welding enables the sheet to be prepared in an effective manner, without producing significant irregularities in the repaired sheet. This also serves to minimize the weight of the frames which do not have to be configured with additional portions to perform the function of keeping the replacement piece flush with the sheet being repaired.

Feasible Modifications of the Invention

The embodiment described above uses vacuum suction cups 21, 21' for fixing the upper and lower frames 1, 1' to the metal sheets 17 And 18, because of their relatively lightweight. However, within the scope of the present invention it is possible to use other means in order to effect such a fixing of the frames 1, 1'. In an exemplifying and non-restricting purpose, electromagnetic means may be mentioned as an alternative to vacuum suction cups.

In the embodiment described above the cutting device may be located at one of three different positions. However, within the scope of the invention it is possible to provide fewer or more positions for the cutting device. As a further alternative, the mounting of the cutting device may be arranged in such a way that the radius of curvature for the cutting tool may be adjusted in a stepless manner.

Although the present invention has been described in connection with preferred embodiments thereof, it will be appreciated by those skilled in the art that other additions, deletions, modifications, and substitutions not specifically described may be made without departing from the spirit and scope of the invention as defined in the appended claims.

What is claimed is:

1. A method of repairing a metal sheet, comprising the steps of:

A) affixing upper and lower frames on top and bottom sides, respectively, of a first metal sheet, one of the frames carrying a rotatable first center element that has a chip-removing cutter mounted thereon;

B) bringing the cutting edge of the cutter into engagement with the metal sheet;

C) rotating the first center element relative to the one frame about an axis extending perpendicular to the first metal sheet, whereby the cutter cuts a circular replacement piece from the first metal sheet;

D) affixing the upper and lower frames to top and bottom surfaces of a damaged second metal sheet to be repaired, the second sheet having the same grade and thickness as the first metal sheet;

E) bringing a cutting edge of a cutter carried by the first center element into engagement with the second metal sheet;

F) rotating the first center element about the axis whereby the cutter cuts-out a portion of the second metal sheet containing a damaged region thereof;

G) replacing the first center element with a rotatable second center element that has a welding tool mounted thereon;

H) positioning the replacement piece in the hole;

I) positioning the welding tool in alignment with a welding seam formed between the replacement piece and a wall of the hole;

J) rotating the second center element relative to the respective frame about the axis while welding the seam for joining the replacement piece to the second metal sheet and while pressing support rollers against the replacement piece and the second metal sheet, respectively, to keep the replacement piece and the second metal sheet flush with one another; and K) applying an inert shielding gas to upper and lower surfaces of the metal sheet during step J.

2. The method according to claim 1 wherein step A further comprises generating suction and transmitting the suction to suction cups carried by the upper and lower frames for affixing the upper and lower frames on top and bottom sides, respectively, of the first metal sheet.

3. The method according to claim 1 wherein the first center element has a chip-removing cutter mounted thereon, the cutter having a cutting edge and being adjustable vertically; step C further comprising adjusting the cutter toward the metal sheet incrementally until the cutter cuts a circular replacement piece from the first metal sheet, and step F further comprises adjusting the cutter toward the second metal sheet incrementally until the cutter cuts-out a portion of the second metal sheet containing a damaged region thereof.

* * * * *

UNITED STATES PATENT AND TRADEMARK OFFICE
Certificate

Patent No. 6,352,194 B1

Patented: March 5, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Alf Larsson, Gävle, Sweden; and Karl-Gösta Naenfeldt, Sandviken, Sweden.

Signed and Sealed this Tenth Day of December 2002.

TOM DUNN
*Supervisory Patent Examiner*
Art Unit 1725